United States Patent [19]
Byford

[11] 4,298,981
[45] Nov. 3, 1981

[54] DECODING SHORTENED CYCLIC BLOCK CODES

[75] Inventor: Roger G. Byford, London, England

[73] Assignee: British Broadcasting Corporation, London, England

[21] Appl. No.: 25,169

[22] Filed: Mar. 29, 1979
(Under 37 CFR 1.47)

[30] Foreign Application Priority Data

Mar. 31, 1978 [GB] United Kingdom ............... 12749/78

[51] Int. Cl.³ .............................................. G06F 11/10
[52] U.S. Cl. ................................................... 371/37
[58] Field of Search ............... 340/146.1 AL, 146.1 A; 371/37

[56] References Cited

U.S. PATENT DOCUMENTS

| | | | |
|---|---|---|---|
| 3,373,404 | 3/1968 | Webb | 340/146.1 AL |
| 3,537,103 | 10/1970 | Webb | 340/347 |
| 3,805,232 | 4/1974 | Allen | 340/146.1 AL |
| 3,811,108 | 5/1974 | Howell | 340/146.1 AL |

FOREIGN PATENT DOCUMENTS

1031186  6/1966  United Kingdom .

OTHER PUBLICATIONS

R. F. Salava, Implementation and Performance of an Error Correction System, Proceeding of National Electronics Conf., Oct. 1964, vol. 20, pp. 693-698.
Kai Ping Yiu, Feedback Polynomial of a Majority Logic Decoder, Electronics Letters, Apr. 15, 1976, vol. 12, Nr. 8, London, Gt. Britain, pp. 195-196.

*Primary Examiner*—Charles E. Atkinson
*Attorney, Agent, or Firm*—Robert F. O'Connell

[57] ABSTRACT

A method of and apparatus for decoding a shortened cyclic block code in which the received codeword is serially shifted forwardly through a bidirectional syndrome register with the generator word being so subtracted from the register content as to effect division of the received codeword leaving the remainder in the register, and, if the remainder is larger than the maximum correctable error, the register contents are so reverse shifted as to reverse the division operation until the register contents are not larger than the maximum correctable error, the register contents then being combined with the received codeword to produce a corrected word. The codeword length does not have to be artificially increased to that of the maximum length code, and thus a reduction of the processing time can be obtained.

3 Claims, 6 Drawing Figures

DECODING SHORTENED CYCLIC BLOCK CODES

This invention relates to improvements in decoding shortened cyclic block codes.

The use of cyclic block codes has been described for example by W. W. PETERSON and D. T. BROWN in a paper entitled 'Cyclic Codes for Error Detection' published in Proc. IRE, Vol. 49, No. 1, Jan. 1961, pages 228 to 236; by SHU LIN in 'Introduction to Error-Correcting codes' published by Prentice-Hall, 1970; and by W. W. PETERSON and E. J. WELDON in 'Error Correcting Codes' published by MIT Press, 2nd edition, 1972. Reference should be made to these publications for a full description of various types of cyclic codes and for their detailed theory.

A brief description of these codes will be given here. The codes act on information in blocks, each block forming an information word I which is to be transmitted or stored. From each information word a lengthened codeword C is produced, which is uniquely related to the information word, and is divisible by a fixed generator word G. The codeword is then transmitted (or stored). At the receiving end of the transmission channel, the received lengthened codeword is divided, for example by means of a shift register with appropriate feedback, by the generator word G. If a non-zero remainder results from this division, then errors must have occurred in transmission. If the generator word has been chosen correctly, this remainder (often referred to as the syndrome) is uniquely related to any error pattern which is to be corrected.

In a given cyclic code, valid codewords have a fixed number of bits 'n' and they must be divisible by the fixed generator word G. If each codeword containing information and check bits is derived from an information word with 'k' bits then the generator word will contain $n-k+1$ bits.

The codes are termed 'cyclic' because all cyclic shifts of a codeword of k bits produce other acceptable codewords, i.e. these other codewords are divisible by the $(n-k+1)$ bit generator word.

All mathematical processes concerned with cyclic codes are performed using modulo-two arithmetic, this is similar to binary arithmetic except $-1=1$ and 'carries' are ignored e.g. $0+0=0$, $0+1=1$, $1+1=0$.

In explanation of error correcting codes, it is often convenient to think of binary numbers as the coefficients of a polynomial in a dummy variable X (such as 2). For example a number 10101 would correspond to the polynomial $X^4+X^2+1$. It should be noted that the order of the polynomial, i.e. the highest power of X, is one less than the number of bits. Let the polynomials C(X), I(X) and G(X) represent a codeword, information word and generator word respectively. The order of these polynomials will be $n-1$, $k-1$ and $n-k$ respectively, corresponding to n, k and $n-k+1$ bits respectively.

The most obvious method of obtaining suitable code polynomials C(X) is to multiply I(X) by G(X). However, the following method is normally used because it has the advantage that the unchanged information word forms part of the codeword, and the remaining bits can be regarded as parity or check bits. In this method, to encode I(X), the function $x^{n-k} \cdot I(X)$ is divided by G(X). If the quotient is Q(X) and the remainder is R(X), then:

$$X^{n-k} \cdot I(X) = Q(X) \cdot G(X) + R(X) \quad (1)$$

This can be rewritten:

$$X^{n-k} \cdot I(X) - R(X) = Q(X) \cdot G(X).$$

It is seen that each side of this equation is divisible by G(X). Since in modulo-two arithmetic, addition and subtraction are the same, a valid codeword C(X) will be given by:

$$C(X) = X^{n-k} \cdot I(X) + R(X) = Q(X) \cdot G(X) \quad (2)$$

The steps involved are thus:
(i) multiple I(X) by $X^{n-k}$
(ii) divide the resultant of (i) by the generator G(X) and note the remainder R(X).
(iii) add the resultant of (i) to the remainder R(X), to give the codeword.

It can be seen that the resulting codeword C(X) fulfills the requirement that it is divisible by the generator word G(X). Also since the order of the remainder R(X) must be less than that of G(X), i.e. less than $n-k$, and $X^{n-k} \cdot I(X)$ must have zero coefficients for powers of X less than $X^{n-k}$, it follows that the k highest order coefficients of C(X) are the same as the coefficients of I(X), and the $n-k$ lowest order coefficients are check bits.

Since the effect of errors is to invert binary digits in the codeword, an error burst is equivalent to modulo-two addition of '1's' to the erroneous positions in the codeword. A received code polynomial $C^1(x)$ can therefore be represented by $$C^1(X) = C(X) + E(X) \quad (3)$$

where C(X) is the transmitted code polynomial and E(X) is an error polynomial with unity coefficients in the erroneous powers of X and zero coefficients elsewhere.

At an error decoder, the received code word $C^1(X)$ is divided by the generator word G(X) and the remainder, the syndrome, is examined. If the remainder is zero, it is assumed that no errors have occurred. [It is however possible that an undetectable error is present corresponding to an error polynomial E(X) which is divisible by G(X)]. If the remainder is not zero, then errors have occurred.

If errors are to be corrected as well as detected, any given remainder (syndrome) must correspond to only one correctable error polynomial. Also, the relationship between remainders and error polynomials must be independent of the transmitted codeword. It can be seen from Eqn. (3) that this latter condition applies to cyclic codes, since C(X)/G(X) gives zero remainder and therefore the remainder obtained from $C^1(X)/G(X)$ is equal to the remainder given by E(X)/G(X). (This can be shown to be true notwithstanding that modulo-two arithmetic is being used). It follows that in analysing the relationship between remainders (syndrome) and error polynomials, it may be assumed for simplicity that the transmitted codeword C(X) was zero.

Further known conditions relating to the correction of errors are as follows:
(a) In order for all burst errors of any length up to b bits to be correctable, then the number of check bits must not be less than 2b, i.e. $(n-k)$ must be not less than 2b. This condition is known as the Reiger bound.

(b) If the sum (or difference) of any two error polynomials is divisible by the generator polynomial G(X), then both polynomials will give the same remainder and therefore neither is correctable.

By applying condition (b), it can be shown that if e is the smallest integer such that $X^e + 1$ is exactly divisible by G(X), then the maximum length of codeword which can usefully be employed has e bits, i.e. n should not be greater than e. A code with n greater than e would not generally be of any practical value since it would not be possible to distinguish between the single errors corresponding to the error polynomials $X^e$ and 1, the sum of these being $X^e + 1$ which by definition is divisible by G(X). The symbol 'e' is often called the 'exponent' of the generator polynomial.

Once E(X) has been determined, an error is corrected by simply subtracting E(X) from $C^1(X)$. In modulo two arithmetic, the same result is obtained by adding E(X) to $C^1(X)$.

The form and implementation of modulo 2 division has important effects on the construction of a practical error corrector; it is carried out as an algebraic division with modulo-2 subtraction. An example is:

```
            101
     ┌─────────
10011│ 1011010
       10011
       ─────
        010110
         10011
         ─────
         0101 ---- Syndrome
```

This process can be carried out using a shift register with appropriate feedback connections. It is assumed that a register is used with one less cell than the number of digits in the divisor (the generator polynomial), and the dividend (the received code word) is entered serially, starting with the most significant bit. Then it can be seen from an examination of the division process that each time a 'one' is in the most significant cell of the register (the last cell), the generator polynomial should be subtracted, and then the shifting process continued until another 'one' appears in the most significant cell. If this operation is continued until the entire received word has been fed into the register, the content at the end of the operation will be the remainder resulting from the division.

Figure 1:
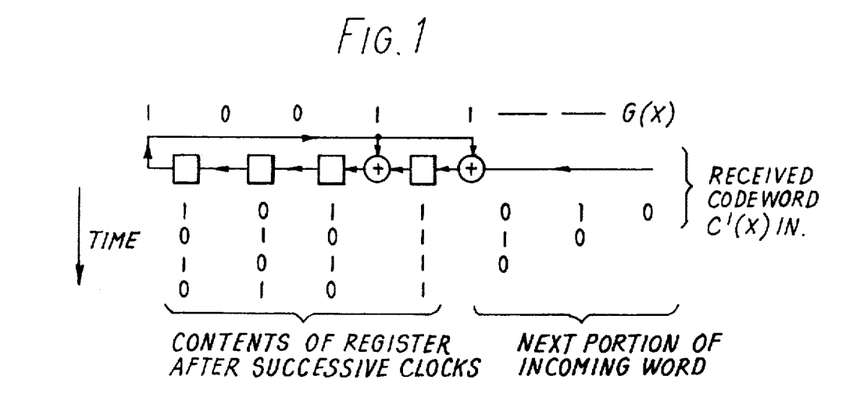
FIG. 1 shows a syndrome register comprised of a series of D-type bistable flip-flop circuits and exclusive-OR gates.

A circuit for performing this division process and storing the remainders can readily be visualized. FIG. 1 of the drawings shows the shift register portion of such a processor; this is frequently referred to as the syndrome register. In the circuit illustrated, the shift register is formed by a series of D-type bistable flip-flop circuits (square blocks). Between certain of the register stages are exclusive-OR gates (i.e. modulo-2 adders). The points at which the exclusive-OR gates are included correspond to the positions of 'ones' in the generator polynomial G(X), except that the left-hand (most significant) one is disregarded.

The operation of the circuit over four clock pulses is indicated on FIG. 1. The received codeword C'(X) is assumed, as in the example above, to be 1011010 and the generator G(X) to be 1011. Whenever there is a zero in the most significant (leftmost) cell, the device acts as a simple shift register as an input to each exclusive-OR gate is zero and the codeword is shifted without modification.

However, if there is a 'one' in the most significant cell, the exclusive-OR gates invert the bits shifted through them, and at the same time the most significant bit is lost. The result is to subtract (modulo-2) the generator word from the shift register contents while shifting the contents by one bit. This is precisely the mathematical operation which takes place during manual long division, as illustrated above.

If the contents of the register are shifted until the least significant bit of the received codeword has entered the rightmost cell in FIG. 1, the word remaining in the register is equal to the remainder or syndrome obtained after dividing $C^1(X)$ by G(X). The fact that the quotient is not stored is of no consequence since the cyclic coding process makes no use of the quotient.

It will be assumed that the error decoder is required to correct all burst errors whose length is no greater than b bits in any one codeword; this defines the maximum correctable error. By the Reiger bound, b can never be greater than half the number $(n-k)$ of check bits in the codeword. The length of an error in a codeword is defined as the distance in bits between the first and last bits which are in error. For example if E and O represent error and no error respectively, errors of length 5 bits could be formed in a variety of ways including EEEEE, EOOOE or EEOEE.

It is necessary to calculate the error burst polynomial which corresponds to a particular remainder (syndrome), obtained after dividing $C^1(X)$ by G(X). One possibility would be to use a "look-up table" stored in a read-only memory. However, this method requires a very large memory if burst errors of more than a few bits are to be corrected, and therefore a better solution must be found if the equipment is to remain economical and compact. Fortunately, it is possible to use a syndrome register to calculate the error polynomial as well as the remainder.

First only codes of maximum length will be considered, i.e. codes in which the length n of the codeword is equal to the exponent 'e' of the generator word, and hence the generator word is an exact divisor of $X^n + 1$.

After n shifts into the syndrome register, the contents are the remainder resulting from division of the received code word by G(X). Since, as stated earlier, the discovery of an error burst is unaffected by the transmitted code word, it may be assumed that the transmitted code word was zero, and therefore that the received code word is simply the error polynomial. Now suppose that the remainder, which has $n-k$ bits, has zero coefficients in its $n-k-b$ most significant bits, i.e. unity coefficients only occur in the b least significant bits. (N.B. $n-k-b \geq b$ since by the Reiger bound $2b \leq n-k$). Such a remainder must be equal to the error polynomial that has occurred. This is because an error polynomial in the b least significant bits of the codeword must produce a remainder equal to itself when divided by G(X), since G(X) has more than b bits; and by definition no other correctable error polynomials are allowed to give the same remainder.

If the remainder is not of the above type and contains 'ones' in the $n-k-b$ most significant bits, (i.e. the order of the syndrome polynomial is greater than b−1), the shifting process is continued feeding in zeroes at the input of the syndrome register, until the remainder does have zeroes in all its $n-k-b$ most significant bits. Each of these shifts will change the content of the register to the syndrome which would have been produced by the previously received codeword polynomial with an extra zero at its least significant end (i.e. multiplied by 2). But the new syndrome is also that which would have resulted from a received codeword polynomial equal to the previous one, but shifted cyclically one place to the left. This is shown by the example below in which $a_{n-1} \ldots a_0$ are the coefficients of the received codeword polynomial $C^1(X)$.

Received polynomial $= a_{n-1}X^{n-1} \ldots a_1X + a_0$     (4)

Received polynominal $\times 2 = a_{n-1}X^n + a_{n-2}X^{n-1} \ldots a_0X + 0$     (5)

Cyclic shift $a_{n-2}X^{n-1} \ldots a_0X + a_{n-1}$     (6)

(5) $-$ (6) $= a_{n-1}X^n - a_{n-1} = a_{n-1}(X^n + 1)$

Now for $a_{n-1} = 0$, $a_{n-1}(X^n + 1) = 0$ and for $a_{n-1} = 1$, $a_{n-1}(X^n + 1) = X^n + 1$.

Therefore, since $X^n + 1$ is divisible by $G(X)$ for maximum length codewords, the remainders obtained by dividing (5) and (6) by $G(X)$ are identical, and the content of the syndrome register after an extra zero has been shifted in, is equal to the remainder which would have been given by the original received code word cyclically shifted once to the left.

Now suppose the received polynomial $C^1(X)$ contains a b-bit error burst extending from bit $m+1$ to $m+b$. Since, as stated earlier, we can assume the transmitted code polynomial $C(X)$ was zero, the original syndrome is equal to that which would have been produced by the error polynomial $E(X)$ which is given by:

$E(X) =$
$\underbrace{0.X^{n-1} \ldots 0.X^{m+b}}_{(n - m - b) \text{ zeroes}} + \underbrace{a_{m+b-1}X^{m+b-1} \ldots a_m X^m}_{b \text{ bit error burst}} + \underbrace{0.X^{m-1} \ldots 0.X^0}_{m \text{ zeroes}}$ As explained previously, if $m=0$, the error polynomial is equal to the initial remainder obtained after the last digit of the codeword has been shifted into the syndrome register. Such errors are identified by the order of the initial remainder being less than b.

If the order of the initial remainder (syndrome) is not less than b, zeroes continue to be entered into the register after completing the division process. The successive remainders obtained correspond to codewords of the form $X^s \cdot E(X)$, where s is the number of extra zeroes which have been entered; it has been shown above that these remainders are also equal to those obtained after s cyclic shifts to the left of $E(X)$. From an examination of $E(X)$, it can be seen that after $(n-m)$ cyclic shifts to the left, the error burst will lie in the b least significant bits and therefore, as already explained, the syndrome register will contain the error burst in its b least significant positions and zeroes in the higher order positions.

It follows that when the further shifting process has been completed, the contents of the syndrome register, cyclically right shifted $(n-m)$ times, will be equal to the error polynomial.

Thus by performing the division, and then further shifting the contents of the syndrome register until the order of the syndrome is less than b the value and position of the error polynomial are found, the first being equal to the contents of the syndrome register, and the second being simply related to the number of shifts which have occurred after the division was completed. It is then a simple matter to bring the contents of the syndrome register and a stored version of the received codeword into alignment, and to correct the errors using exclusive-OR gates.

Unfortunately, this form of corrector only works for a maximum length code. Unless $G(X)$ divides into $X^n + 1$, the difference between a cyclically shifted codeword and one to which a zero has been added is not divisible by $G(X)$, so that the process of adding zeroes to the incoming word by continuing to shift the syndrome register is not analogous to a cyclic shift of the code word. If a code of less than maximum length is used, termed a shortened code, the decoder therefore has to be modified.

A known method is to effect a simple modification to the decoder for maximum length codes, by noting that the encoding procedure is such that adding zeroes to the leading end of an information word will not change the check bits, and that a shortened codeword can therefore be transformed into a maximum length one simply by adding zeroes to its leading end. This maximum length codeword can be decoded as before, but the number of shifts required to perform the division will be greater than the number required to divide into the shortened code word by an amount equal to the number of added zeroes. If, therefore, the maximum length is very much greater than the length in use, this process will unduly extend the time required to decode the incoming words.

As an example, suppose a received 7-bit codeword contains errors corresponding to:

O E E O O O O where E indicates an error and O no error. Assuming the maximum length of codeword for the generator polynomial being used has e bits, then the remainder obtained after this 7 bit word has been clocked into the syndrome register would be the same as the remainder from the e bit codeword:

$\underbrace{0 \ldots 0}_{e\text{-}7 \text{ zeroes}} 0EE0000$

On further clocking of the syndrome register the remainders would correspond to the codewords:

00 . . . 00EE0000 after 1 clock pulse
00 . . . 00EE00000 after 2 clock pulses
↓       ↓
$\underbrace{\begin{array}{l}\text{EE00 . . . . . . . 00 after (e-6) clock pulses}\\\text{E00 . . . 00E after (e-5) clock pulses}\\\text{00 . . . 00EE after (e-4) clock pulses}\end{array}}_{e \text{ bits}}$ At this point the shifting process is complete, and assuming that two-bit errors are correctable the remainder in the syndrome register will have EE in its two least significant bits and zeroes in higher order bits. The error polynomial in the received codeword is then given by cyclically shifting EE by $e-4$ positions to the right in the e-bit codeword. This shifting is equivalent to a 4-bit cyclic shift of EE to the left in both the e-bit and 7-bit codewords.

A modification to this system has been described by Peterson and Weldon in their book but is fairly complex and does not greatly decrease the decoding time.

In summary, therefore, it is seen from the above that a known procedure for calculating the error polynomial from the syndrome is to continue to shift the syndrome register contents until the error polynomial appears at the least significant bit positions. When a shortened code is used, the codeword length has to be artificially increased to that of the maximum length code. Thus the time taken for the shifting is the same for a shortened code as for the maximum length code.

This invention permits a reduction of the processing time in the decoding of shortened cyclic block codes.

The invention provides a method of and apparatus for decoding a shortened cyclic block code in which the received codeword is serially shifted forwardly through a bidirectional syndrome register with the generator word being so subtracted from the register content as to effect division of the received codeword leaving the remainder in the register, and, if the remainder is larger than the maximum correctable error, the register contents are so reverse shifted as to reverse the division operation until the register contents are not larger than the maximum correctable error, the register contents then being combined with the received codeword to produce a corrected word.

An example of the invention will now be described. Reference will be made to the remaining figures of the drawing of which.

With a view to reducing the necessity for lengthening the shortened codeword to the maximum codeword length and then shifting the entire lengthened codeword, in accordance with this invention the syndrome register is made bidirectional, to permit the division process to be reversed while zeroes are being shifted out of the right-hand end of the syndrome register and provides a means of correcting either shortened or maximum length codes with no more reverse shifts than the number of bits in the actual codeword.

As an example of what is meant by such reversing of the division process, suppose a received 7-bit codeword contains errors of the form given above, i.e.

O E E O O O O

The remainders obtained in the reversed division process will correspond to the codewords:

O O E E O O O—after 1 clock pulse
O O O E E O O—after 2 clock pulses
O O O O E E O—after 3 clock pulses
O O O O O E E—after 4 clock pulses It will be seen that this last shifted codeword must give the same remainder as the codeword obtained after (e-4) clock pulses in the example of the known method given above. It can thus be seen that if e is much larger than the length of the codeword in use, as it frequently is, the process of shifting the errors into the least significant bits will require far less clock pulses than the known method described above.

Figure 2:
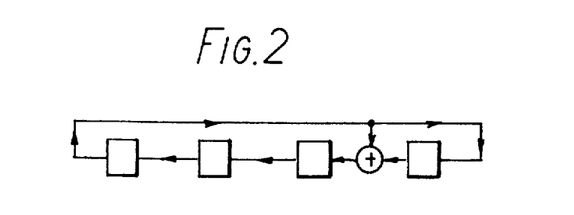
FIG. 2 is an equivalent circuit diagram of the syndrome register of FIG. 1 when it has zeroes at its input.

It will now be shown that the 'undoing of the division' by reversing the direction of shift can readily be accomplished. If at some point in the division process the next incoming bit is a zero, then the effective circuit of the syndrome register of FIG. 1 is as shown in FIG. 2.

By considering an example such as that to be given below, it can be seen that the effect of the next shift to the left can be 'undone' by a following reverse shift (i.e. shift to the right) in which the signals through the flip-flop circuits flow in the opposite direction to that shown in FIG. 2. Hence the 'undoing' procedure described above can be accomplished by making the syndrome register, and the gates within it, bidirectional.

Figure 3:
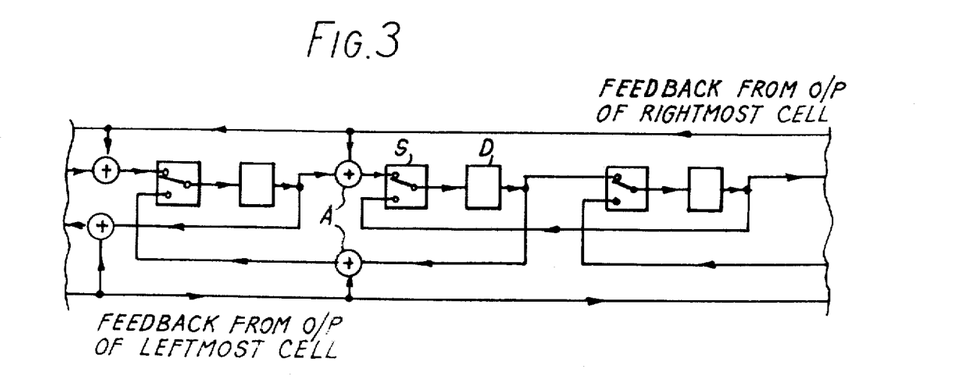
FIG. 3 shows three stages of a bidirectional syndrome register used in accordance with the invention.

FIG. 3 shows three stages of such a syndrome register. Each stage includes a D-type bistable flip-flop D which provides the output of the stage and is connected to the output of a two-way data selector S. The two inputs of the data selector are connected respectively to the outputs of the two stages to either side of the stage in question, with the interposition, when appropriate in accordance with the generator polynomial being used, of exclusive-OR gates A which add to the output of the adjacent stage the output of the appropriate end stage of the register. The data selectors are all controlled by a common control signal. When in the 'down' position, the register is operable to shift to the left, and is effectively identical to the circuit shown in FIG. 2. When the data selectors are in the 'up' position, as shown, reverse shifting to the right can take place.

Figure 4:
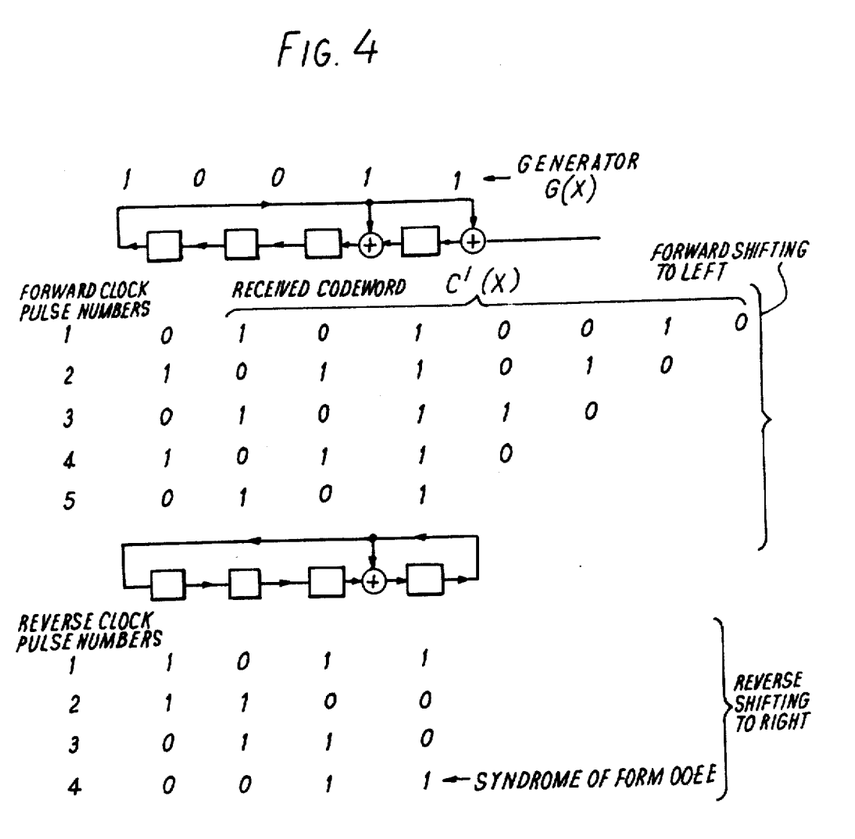
FIG. 4 is a diagrammatic representation of the operation of the register of FIG. 3.

An example of the operation of such a syndrome register is illustrated in FIG. 4. It is assumed that the received codeword is 1011010 and the generator word is again 10011. Since the generator word has five digits, only errors of length less than 5/2 digits can be corrected, i.e. only errors with a length of one or two digits can be corrected. During the forward clock pulses up to pulse numbered 2 the received codeword is serially clocked into the register without modification. At this point however a 'one' is held in the left-hand stage of the register, so that at the next clock pulse 3 the generator word is subtracted from the register contents before shifting. The same operation occurs at clock pulse 4. In this way the received codeword has been divided by the generator word and the remainder is now held in the register.

Once the codeword has been fully entered into the register, so that the remainder of the division operation is held, the procedure is as follows. All the register stages except to the last two are tested to see whether they contain zeros. If all these register stages contain zeros, then the register already contains the error polynomial. If the last two digits are also zero, then the error polynomial is zero and the codeword contains no correctable errors. The first three digits of the codeword are thus the required information word.

In the example illustrated, the register stages excluding the last two, that is to say the first two stages, are not zero. Reverse shifting therefore takes place during reverse clock pulses numbered 1 to 4. During this reverse shifting the exclusive - OR gate coupled to the right of the right hand register stage is ineffective, and the only operative gate is coupled to the output of the right-hand stage and to the output of the second stage from the right. The output of the right-hand stage is also applied as the input to the left-hand stage. All this is achieved by changing over switches S in FIG. 3.

After each reverse shift the first two digits held in the register are tested for zero. In the example illustrated they are both zero after reverse clock pulse 4. The register content is then 0011. To derive the error word, which has the same number of digits as the codeword, the register content is now shifted without modification to the left by as many bits as there were reverse clock pulses, i.e. 4 in this example. This gives 00110000 which means that the error word is 0110000. The corrected codeword is thus the received codeword 1011010 plus the error word 0110000 which gives 1101010. The information word is therefore 110.

The complete general procedure for determining the error polynomial is thus as follows. First, the syndrome register is clocked to the left n times to perform the division, where n is the number of bits in the actual codeword. The remainder at this time is equal to that which would have been produced by a received error polynomial of the form:

As with maximum length codes, the syndrome register is now examined for zeroes in its $n-k-b$ most significant bits, where $n-k$ is the number of bits stored in the register and b is the maximum length of error to be corrected. If those bits are zero, the error burst must lie in the b least significant bits of the received codeword and the error polynomial is equal to the remainder in the syndrome register. If, however, the $n-k-b$ most significant bits are not all zero, reverse shifting is commenced.

When the error burst has been shifted into the b least significant bits of the dividend, the remainder in the register is equal to the error burst, this state being recognised by all zeroes in the $n-k-b$ most significant bits of the register. If s right shifts have occurred to reach this state, the order of most significant digit of the error polynomial in the original codeword was $X^{b-1+s}$ and therefore the original codeword can now be corrected.

It will be noted that during the reverse shifting process only zeroes were removed from the right-hand end of the dividend, thus fulfilling the conditions necessary for the division process to be reversible.

Figure 6:
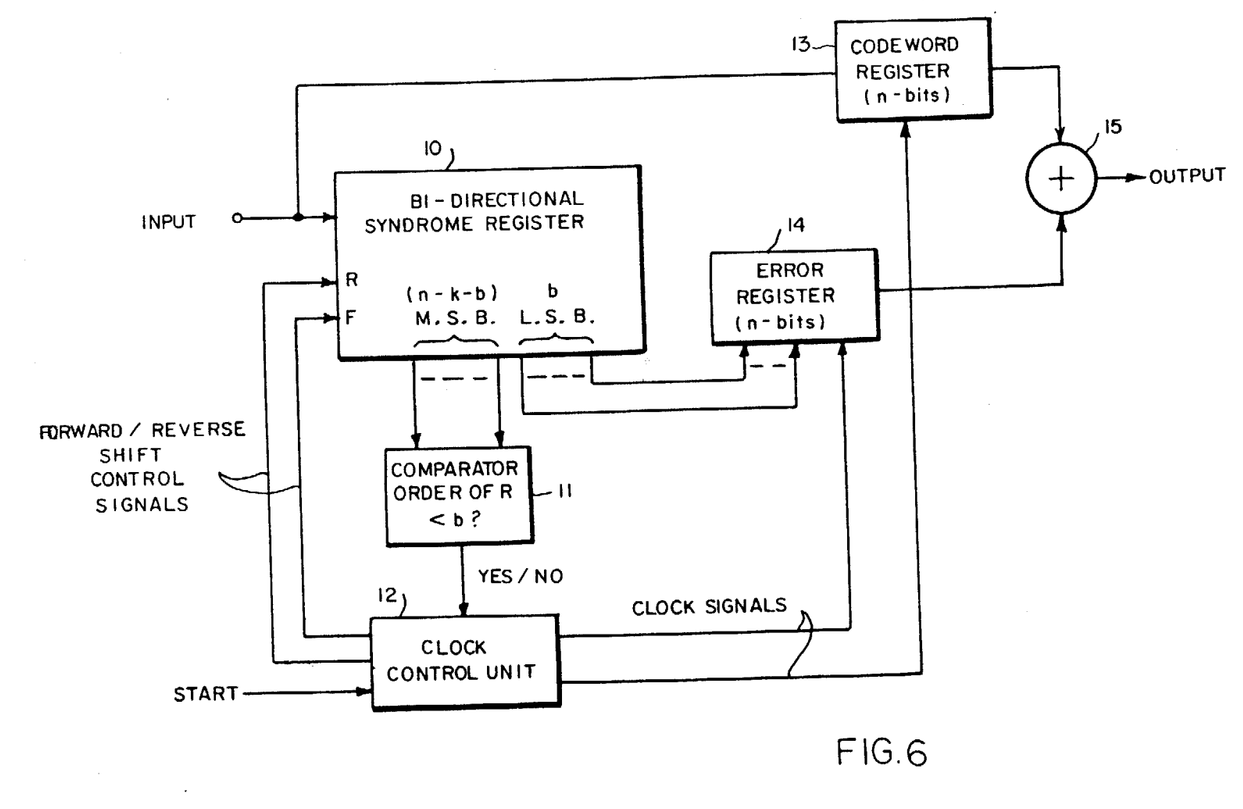
FIG. 6 is a block diagram of an apparatus representing an embodiment of the invention.

FIG. 6 shows a block diagram of an apparatus for performing the above operations. The codeword which has been entered into a syndrome shift register 10 is shifted in a forward direction n times to perform the division by the generator word. The $(n-k-b)$ most significant bits are examined by comparator 11 to determine if the order of the remainder R of the division operation is less than b. If not, the clock control unit 12 responds to the comparator (a "NO" condition) so as to reverse shift the register until the condition is fulfilled. The original codeword is entered into a codeword register 13. If shifting is terminated when the order of the remainder is less than b, the b least significant bits are entered into the error register 14 and the codeword and error word are suitably combined by combining means 15 to produce the corrected word.

The improved method of decoding shortened codes, which is described above, differs from the normal method in that the processing time is proportional to the length of the codeword actually in use rather than to the maximum length of codeword which can be used for the given generator polynomial. Therefore if the actual codeword is much shorter than the maximum length codeword, the improved method considerably decreases the decoding time and this is achieved without any significant increase in instrumental complexity.

Figure 5:
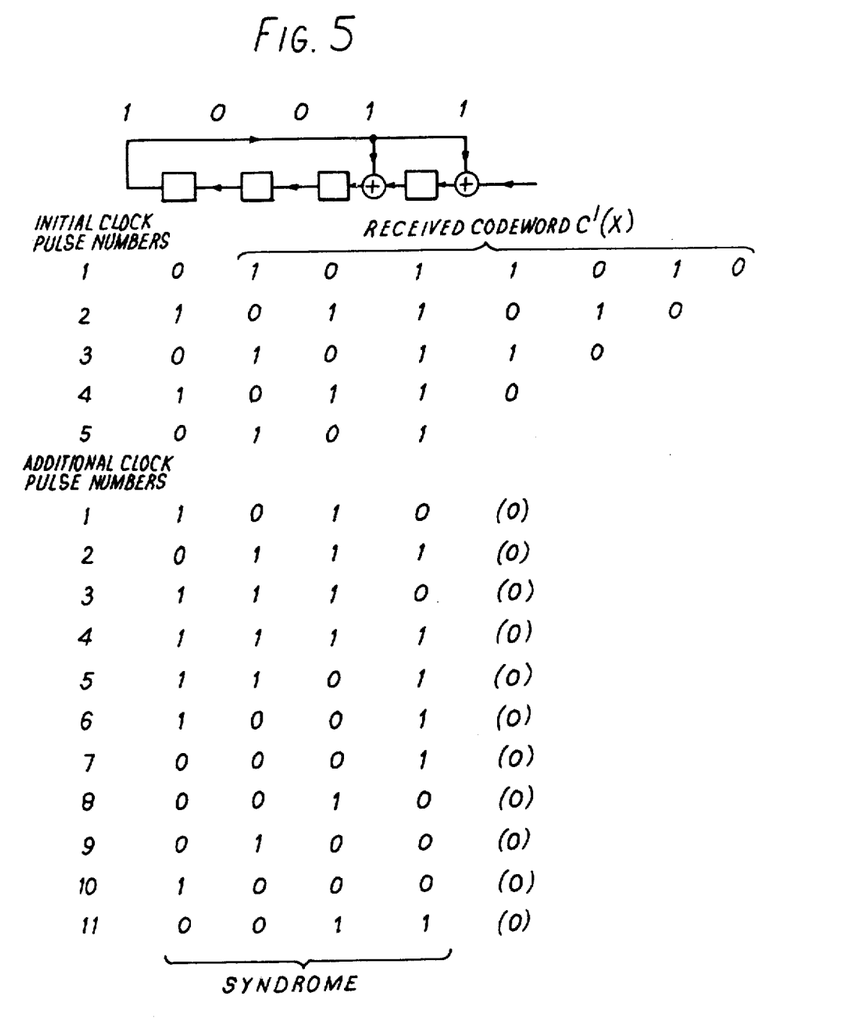
FIG. 5 is a representation similar to FIG. 4 for a known method.

This may be seen by reference to FIG. 5, which illustrates the known method of deriving the error polynomial, in a manner similar to FIG. 4. The initial shifting of the codeword until it is fully entered is the same as in FIG. 4, but thereafter the shifting continues in the forward direction, with zeroes entered at the register input.

If f equals the number of shifts required after the codeword has been entered in order to obtain a syndrome of the form OOEE, and e is the exponent of the generator word G(X) (i.e. e is the smallest integer such that $(X^e+1)$ is exactly divisible by G(X)), an intermediate error word is obtained by cyclically shifting the e-bit word to the right f times. That is, the intermediate error word is:

For codewords with n digits, the final error word E(X) is obtained by selecting the n least significant digits of the intermediate error word.

This process will only give the correct result if all the error (E) digits in the intermediate error word lie within its n least significant digits. That is, for a two digit error burst, assuming f is not equal to zero, it is necessary that:

$$n \geq e-f+2$$

i.e. $f \geq e-n+2$

It follows that the contents of the syndrome register should be ignored until this minimum value of f has been reached.

The maximum value of f that is ever required gives one zero to the right of the E digits in the intermediate error word, i.e. the maximum value of $f=e-1$.

If the syndrome register is clocked more than e times after the codeword has been entered, the contents of this register repeat in the same sequence as in the first e clock pulses.

For the example being considered, $n=7$ and it can be shown that $e=15$ and therefore the only values of f giving useful results are values lying between 10 and 14 inclusive. With this example, the digits stored in each element of the normal decoder syndrome register are indicated in FIG. 5. This figure shows that the conditions that the contents of the register should be of the form OOEE for a value of f between 10 and 14 are fulfilled by OOEE=0011 at f=11. It follows that the intermediate error word is:

$$\underbrace{000000000}_{(11-2) \text{ zeroes}} \quad 11 \quad \underbrace{0000}_{(15-11) \text{ zeroes}}$$

The wanted error word E(X) is given by the seven least significant digits of this intermediate error word:

i.e. $E(X) = 0110000$

This is the same value of E(X) as that given by the improved method of FIG. 4 but 11 additional clock pulses were required after the codeword had been entered instead of 4 clock pulses in the improved method.

It can be shown that for generator words G(X) with $(n-k+1)$ digits, there exists at least one generator word G(X) with an exponent $e = 2^{n-k} + 1$. This expression gives the maximum possible value of e, and although most generator words will have a lower value, it is a useful guide to the order of magnitude of e to be expected for a given number of bits in the generator word.

In a particular application concerning digital recording on magnetic tape, I wanted to correct 7-bit error bursts in codewords of 28 bits including 15 check bits. Several suitable 16-bit generator words were found and the one which was finally chosen was selected on the basis of minimising the number of exclusive-OR gates in the syndrome register. The exponent of this generator word was not known, except that the computer processing indicated that it was greater than one hundred and the theory given above shows that it was less than $2^{15}$. Therefore using the decoding method of FIG. 5, the number of additional clock pulses required after the codeword had been entered into the syndrome register would have been between about 100 and 16,000 depending on the actual value of e, whereas the improved decoding method of FIG. 4 required a maximum of 21 additional clock pulses.

I claim:

1. A method of decoding a shortened cyclic block code, comprising the steps of serially shifting a received codeword forwardly through a bidirectional syndrome register while so subtracting a generator word from the register content as to effect division of the received codeword, leaving the remainder in the register, and if the order of the remainder is not less than the number of bits in a maximum length correctable error, so reverse shifting the contents of the register as to reverse the division operation until the remainder is less than the number of bits in a maximum correctable error, and then combining the register contents with the received codeword to produce a corrected word.

2. Apparatus for decoding a shortened cyclic block code, comprising an input terminal, a bidirectional syndrome register, connected to said input terminal, first means for serially shifting a received codeword forwardly through the syndrome register, said first means and said syndrome register being so constructed that during said shifting a generator word is so subtracted from the register content as to effect division of said received codeword leaving the remainder in the register, second means for determining if the order of the remainder is not less than the number of bits in a maximum length correctable error, and if so for causing the first means so to reverse shift the register contents as to reverse the division operation until the order of the remainder is less than the number of bits in a maximum length correctable error, and third means operative thereafter to combine the register contents with the received codeword to produce a corrected word.

3. Apparatus according to claim 2, in which the syndrome register comprises a series of bistable circuits interconnected by switching means which selectively enable shifting in the forward or reverse direction.

* * * * *